(12) United States Patent
Song et al.

(10) Patent No.: US 6,528,896 B2
(45) Date of Patent: Mar. 4, 2003

(54) SCALABLE TWO TRANSISTOR MEMORY DEVICE

(75) Inventors: Seungheon Song, Sungnam (KR); Woosik Kim, Suwon (KR); Hokyu Kang, Sungnam (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/884,911

(22) Filed: Jun. 21, 2001

(65) Prior Publication Data

US 2002/0196649 A1 Dec. 26, 2002

(51) Int. Cl.[7] .............................................. H01L 27/11
(52) U.S. Cl. ..................... 257/903; 257/904; 257/331; 365/63
(58) Field of Search .............................. 257/903, 904, 257/331; 365/63

(56) References Cited

U.S. PATENT DOCUMENTS

| | | | |
|---|---|---|---|
| 5,952,692 A | 9/1999 | Nakazato et al. | ............ 257/321 |
| 6,330,179 B1 * | 12/2001 | Yang | ........................... 365/145 |
| 2002/0006058 A1 * | 1/2002 | Nakajima et al. | ........... 365/171 |

OTHER PUBLICATIONS

Nakazato et al, "PLED–Planar Localised Electron Devices", IEDM 97, pp. 179–182 [©1997 IEEE]Jul.

* cited by examiner

Primary Examiner—David Nelms
Assistant Examiner—Tu-Tu Ho
(74) Attorney, Agent, or Firm—Lee & Sterba, P.C.

(57) ABSTRACT

A Scalable Two-Transistor Memory (STTM) cell array having a $4F^2$ unit cell area, where F is the minimum feature size. The data lines and the bit lines alternate and are adjacent to each other along the Y-axis direction, and the word lines are laid out along the X-axis direction. Each STTM cell consists of a floating gate MOS sensing transistor at the surface of a semiconductor substrate, with a vertical double sidewall gate multiple tunnel junction barrier programming MOS transistor on top of the sensing transistor. A data line connects all source regions of the programming transistors and a bit line connects all the source/drain regions of the sensing transistors in a column direction. A word line connects all double sidewall gate regions of programming transistors in a row direction. This invention also deals with a column addressing circuit as well as the driving method for the circuit.

18 Claims, 6 Drawing Sheets

SCALABLE TWO TRANSISTOR MEMORY DEVICE

BACKGROUND OF THE INVENTION

1. Field of the Invention

The present invention is generally directed to semiconductor devices and, more particularly, to the structure of a new planar small dimensional memory cell array and its addressing circuitry.

2. Description of Related Art

DRAM semiconductor devices have an advantage of a possible higher integration density as compared to other memory devices such as SRAM semiconductor devices, but DRAM semiconductor devices cannot maintain a decreasing stored charge, as required by scaling, due to leakage current from memory cells, internal noise, and soft errors caused by incident alpha particles. Therefore, the memory cells of such devices require constant refreshing in order to maintain data stored in the memory cells. Thus, power consumption is large even in stand-by mode.

Flash memory devices or EEPROM devices, on the other hand, have a merit in that there is no need to refresh the memory cells in order to maintain data stored in the memory cells. However, a primary drawback of flash memory devices is that it is difficult to improve its relative slow access time because it takes a relatively long time to program the memory cells. Moreover, a high voltage is necessary to program (write) or erase memory cells of flash memory devices. The high electric field applied during erase/write cycles degrades the $SiO_2$ tunneling barrier to the floating gate over a predetermined number (typically about $10^5$) of erase/write cycles and, as a result, limits the operational life of the memory device. Thus, there is a need for a novel memory cell device that combines the advantages of DRAM and flash memory. In other words, there is a need for a semiconductor memory device having memory cells that allow scalable memory charge relative to cell density of the device with long-term retention, low voltage, high speed, and highly reliable operational characteristics. One such novel memory cell, which can be named as a Scalable Two-Transistor Memory cell, has been proposed by Nakazato et al. (refer to IEDM 97, pp. 179–182 and U.S. Pat. No. 5,952,692). Nakazato et al. referred to their device as a Planar Localized Electron Device Memory (PLEDM) cell. This memory cell has non-volatile, high-speed, very low-power dissipation, and high cell density characteristics. It also has an isolated memory node, which provides immunity against soft errors, a gain property, which provides a large S/N ratio. It is a quantum tunneling device working at room temperature with no hot carrier degradation effects, and can be fabricated by existing silicon processing technology.

FIG. 1(a) is a cross-sectional view and FIG. 1(b) is a simple schematic diagram of a typical Scalable Two-Transistor Memory (hereinafter referred to as STTM) cell. The STTM cell comprises a sensing (bottom) transistor (1), which is also known as a read or an access transistor; and a programming (top) transistor (2), which is also known as a write transistor. As shown in FIG. 1(c), the programming (top) transistor is a vertical double wall gated MOSFET with a multiple tunnel junction barrier (4) between the source and the drain. The sensing (bottom) transistor is basically a conventional MOSFET consisting of a floating gate (6) (also functioning as a storage node of the memory cell), a drain (7) (functioning as a sense line, S; corresponding to a bit line) and a source (8) (functioning as a ground line, G; at a ground or a specific potential). As shown in FIG. 1(d), in an STTM cell, the programming (top) transistor (9) is stacked on the gate (6) of the sensing (bottom) transistor. The storage node (6) (floating gate of the sensing or bottom transistor) also functions as the drain region (10) of the programming (top) transistor. As shown in FIG. 1(d) and FIG. 1(e), the control gate (11), formed over the sidewalls of the barrier structure (4) and the storage node (6), functions as a control gate line X (which is also known as the write line or word line). The programming (top) transistor's source region (12) functions as a data line Y. The MTJ barrier structure is formed by alternatively and sequentially depositing an insulating layer (13) and a semiconductor layer (14).

In the write mode, a data voltage is applied to the data line Y (12) and a write voltage (i.e., program voltage) is applied to the write (or word or control gate) line X (11). Therefore, barrier height between the Y line (12) and the storage node (6) is reduced, and tunneling current flows through the insulating layer. As a result, charges (electrons or holes) may be stored in the storage node (6).

These stored charges change the threshold voltage of the sensing (bottom) transistor (1). For example, in the event that the electrons are stored in the storage node (6) and the sensing (bottom) transistor (1) is an NMOS transistor, the threshold voltage of the sensing (bottom) transistor (1) is increased towards the positive voltage. In a STTM cell, the write operation can be achieved with a low write voltage, as compared to a flash memory device. This is because in a STTM cell, the charge flow into the storage node is controlled by write (or word or control gate) line X (11) as well as the data line Y (12).

In order to read (sense) the data stored in a STTM cell, a read voltage is applied to the write (or word or control gate) line X (11) and an appropriate voltage is applied to the ground line G (8). Next, a sense amplifier (not shown) detects the current that flows through the sense line S (7). In this case, in the event that the threshold voltage of the sensing (bottom) transistor (1) is higher than the read voltage, the sense line current may not flow. If, however, the threshold voltage of the sensing (bottom) transistor (1) is lower than the read voltage, the sense line current may flow.

In the above STTM cell, the storage node (6) is completely surrounded by insulating material (i.e., completely floated) unlike the storage node of DRAM cell. Thus, in the event that the write voltage is much higher than the read voltage, there is no need to refresh the memory cells. Alternatively, the write (or word or control gate) line can be separated into two write lines with the sensing transistor controlled by a first write line and the programming transistor controlled by a second write line. In this case, even though the write voltage approximates the read voltage, the programming (top) transistor (2) is not turned on during the read operation. Accordingly, it is not required to refresh the memory cell regardless of the difference between the write voltage and the read voltage.

FIG. 2 is a possible equivalent circuit diagram of a cell array region in STTM (also called PLEDM). The circuit symbol used for the STTM cell in FIG. 2 and other circuit diagrams later is shown in FIG. 1(f). Referring to FIG. 2, a plurality of parallel word lines (WL1 to WL5) are arranged in rows parallel to an x-axis of the STTM cell array. Each of the word lines is electrically connected to the sidewall control gates X (11) of the memory cells, which are arrayed in a row direction. Also, a plurality of parallel data lines (DL1 to DL3) are arranged in columns parallel to a y-axis of the STTM cell array. Each of the data lines is electrically connected to the upper nodes of the MTJs Ys (12) of the memory cells, which are arrayed in a column direction. The upper nodes of the MTJs (12) are also the source terminals of the programming transistors (2). As shown in FIG. 2, a plurality of parallel bit lines (BL1 to BL3) are also disposed in a column direction in-between the plurality of data lines. Each of the bit lines is electrically connected to the source (8) or drain (7) regions (S or G in FIG. 1) of the sensing (bottom) transistors (1) of the memory cells, which are arrayed in a column direction.

As explained above, a unit STTM cell is operated by three control lines: the write (or word or control gate) line (11), the bit line (7 or 8) and the data line (12), whereas a unit DRAM cell is operated by only two control lines: the write (word) line and the bit line. Thus, there continues to be a need for compact layout of the cell array region in order to increase the integration density of STTM. In addition, at least two of the three control lines (the word line, the bit line and the data line) should be disposed in parallel. For example, the bit lines and the data lines are disposed in parallel as shown in FIG. 2. Thus, there continues to be a need for compact layouts of data line extensions and bit line extensions in a core region. Also, there continues to be a need for novel column addressing schemes to the bit lines and data lines in a limited cell pitch. The present invention is directed to a new layout structure for a STTM cell array, which allows an easy scaling of a unit cell area as the minimum feature sizes shrink. The present invention is also directed to new memory cell array addressing schemes and driving methods for the STTM cell arrays. The unit cell area in this invention is as low as $4F^2$, where F is a minimum feature size and represents width of a data line (12) or a word (or write or control gate) line or spacing between two adjacent data lines or the word lines.

SUMMARY OF THE INVENTION

A primary feature of an embodiment of the present invention is directed to a structure of a Scalable Two-Transistor Memory (STTM) cell array, wherein a unit cell area is as low as $4F^2$ where F is the minimum feature size. In this compact design, the minimum feature size F may also represent width of the three control lines, namely the data lines, the bit lines and the word lines, and the separation between two adjacent bit lines, word lines and data lines. The data lines and the bit lines alternate and are adjacent to each other in a direction parallel with a Y-axis of the unit cell, and the word lines run along a direction parallel with a X-axis of the unit cell. Each STTM cell consists of a floating gate MOS sensing (bottom) transistor at the surface of a semiconductor substrate, with a vertical double sidewall gate multiple tunnel junction (MTJ) barrier programming (top) transistor on top of the sensing (bottom) transistor. The active MTJ barrier regions have island type isolation regions in-between them in the Y-axis (column) direction. The data lines run over the isolation islands making contact to the source regions of the programming (top) transistor. Bit lines are made from either continuous heavily doped regions within the semiconductor substrate, adjacent to the floating gate of the sensing (bottom) transistor, or the heavily doped silicon, metal, metal silicide, polycide layers or their multi-layer combinations formed on top of the continuous doped regions within the semiconductor substrate. These continuous doped regions also act as the source/drain regions of the sensing (bottom) transistor. From a top view, the bit lines and the data lines touch each other to result in a compact unit cell memory array. The word lines run over the double sidewall gate regions of the STTM cell array in a direction parallel with an X-axis of the STTM cell array. To achieve smooth planar surface, the space between word lines on top of the bit lines is filled with an insulating material. The present invention also provides a layout of the bit line and data line extensions in the core region, a cell array addressing scheme, and a driving method of the circuit. These and other features of the present invention are realized by the present invention wherein according to a preferred embodiment, there is provided a semiconductor device having a scalable two-transistor memory (STTM) cell array comprising:

a semiconductor substrate;

a plurality of memory cells on the substrate arranged in a planar matrix having an x-axis and a y-axis;

each memory cell having a bottom transistor and a top transistor in a stacked configuration;

island type isolation regions located in the substrate between and adjacent to memory cells, the island type isolation regions and the adjacent memory cells forming columns parallel to the y-axis of the matrix with source and drain regions of the bottom transistor located between the columns;

three types of control lines, including bit lines, data lines, and word lines, each bit line and data line extending in a direction parallel with the y-axis in an alternating manner and the word line extending in a direction parallel with the x-axis;

wherein each bit line being electrically connected to source/drain regions of adjacent bottom transistors along each column, each data line being electrically connected to the source regions of top transistors along each column of the island type isolation regions and adjacent memory cells, and each word line being electrically connected to gates of the top transistors in a row; and whereby a unit cell of the plurality of memory cells occupies a minimum area equal to $4F^2$, where F represents a minimum feature size.

According to a feature of an embodiment of the present invention, the semiconductor substrate material is selected from a group consisting of silicon, silicon-germanium, silicon-germanium on silicon, silicon-germanium-carbide on silicon, and silicon on insulator (SOI).

According to another feature of an embodiment of the present invention, in a compact design F may also represent width of the three control lines, namely the data lines, the bit lines and the word lines, and separation between two adjacent bit lines, word lines and data lines.

According to another feature of an embodiment of the present invention in each memory cell, the bottom transistor is a floating gate MOS transistor serving as a sensing transistor and the top transistor is a vertical double sidewall gated MOSFET with a multiple tunnel junction (MTJ) barrier structure sandwiched between a source and a drain, and the floating gate of the bottom transistor functioning as the drain of the top transistor and the source of the top transistor is available as a node at the top of the cell. The top transistor functions as a programming transistor.

According to yet another feature of an embodiment of the present invention, the multiple tunnel junction barrier may consist of alternating layers (up to 20) of a low band gap (<3.5 eV) semiconductor layer and a large band gap (<10 eV) insulator layer. Materials for the low band gap semiconductor layers of the MTJ barrier are selected from a group consisting of silicon, germanium, silicon germanium, and silicon germanium carbide; and materials for the large band gap insulator are selected from a group consisting of silicon oxide, silicon nitride, silicon oxy-nitride, metal oxides, metal nitrides and metal silicates.

According to another feature of an embodiment of the present invention the bit lines are formed either by continuous, heavily doped source/drain regions of the bottom transistor within the semiconductor substrate, running parallel with the Y-axis; or by heavily doped silicon, metal, metal silicide, or polycide layers and their multi-layer combinations formed on top of the continuous doped source/drain regions of the bottom transistor within the semiconductor substrate. The data lines and word lines are also formed by heavily doped silicon, metal, metal silicide, or polycide layers and their multi-layer combinations.

According to another feature of an embodiment of the present invention, the source of the top transistor and the floating gate of the bottom transistor, which also functions as the drain of the top transistor, are doped semiconductors selected from the group consisting of silicon, germanium, silicon germanium, and silicon germanium carbide.

According to another feature of an embodiment of the present invention, the space between the word lines on top of the bit lines is filled with an insulator material to provide planarity at the surface of cell array.

Another embodiment of the present invention is a method of manufacturing a scalable two-transistor memory (STTM) cell array, comprising the steps of:

forming an island type isolation regions in the substrate;
   forming a planar array of memory cells having two transistors, each memory cell having a top transistor on a bottom transistor on a semiconductor substrate, the array having symmetry along an x-axis and a y-axis, the array having rows of memory cells running parallel with the x-axis and columns of memory cells running parallel with the y-axis;
   forming data lines over each of the column of memory cells;
   forming bit lines between all adjacent columns of memory cells; and
   forming word lines over each of the row of memory cells;
   whereby a unit cell of the plurality of memory cells occupies a minimum area equal to $4F^2$, where F represents a minimum feature size and may also represent the width of data lines, bit lines, and word lines and also the distance between two adjacent data lines, bit lines, or word lines.

According to another feature of an embodiment of the present invention, the bit lines and data lines are extended to the core region for making connections to an address system circuitry.

According to yet another embodiment of the present invention the address system for addressing a plurality of STTM cells comprises:

select lines;
   a logic circuit unit having a plurality of switches, each switch controlled by at least one select line;
   external data feed lines;
   external bit control lines;
   each external data feed line selectively and electrically connected by the logic circuit unit to one of the data lines of the STTM cell array;
   each external bit control line selectively and electrically connected by the logic circuit unit to one of two adjacent bit lines of the STTM cell array; and
   at least one of the word lines being selectively and electrically connected to an external signal.

Another embodiment of the present invention for addressing a plurality of STTM cells comprises:

a first memory cell column array and a second memory cell column array;
   three types of control lines, including bit lines, data lines and word lines, wherein each of the memory cell column array is connected to one data line, one bit line, one shared bit line and a plurality of word lines;
   a first and second select lines;
   external data feed lines; and
   a first, a second, a third and a fourth MOSFET, with each MOSFET controlled by one of the select lines;
   wherein the first MOSFET is connected to the data line of the first memory cell column array, the second MOSFET is connected to the second bit line adjacent to the second memory cell column array, the third MOSFET is connected to the first bit line adjacent to the first memory cell column array, the fourth MOSFET is connected to the data line of the second memory cell column array, and the second and third MOSFETs are also connected to the bit line shared by the first and second memory cell column arrays;
   the first select line is connected to gates of the first and second MOSFETs and the second select line is connected to gates of the third and fourth MOSFETs; and
   wherein the first and fourth MOSFETs are each connected to the external data feed line.

An appropriate signal connected to the word line of a memory cell in the first column of memory cells may be either a write voltage or a read voltage or a standby voltage. Moreover, a voltage difference may exist between two adjacent external bit lines when the appropriate signal connected to the word line is a read voltage.

Signal connected to the word line when information is being stored in the STTM cell is a standby voltage.

DETAILED DESCRIPTION OF THE INVENTION

Figure 1A:
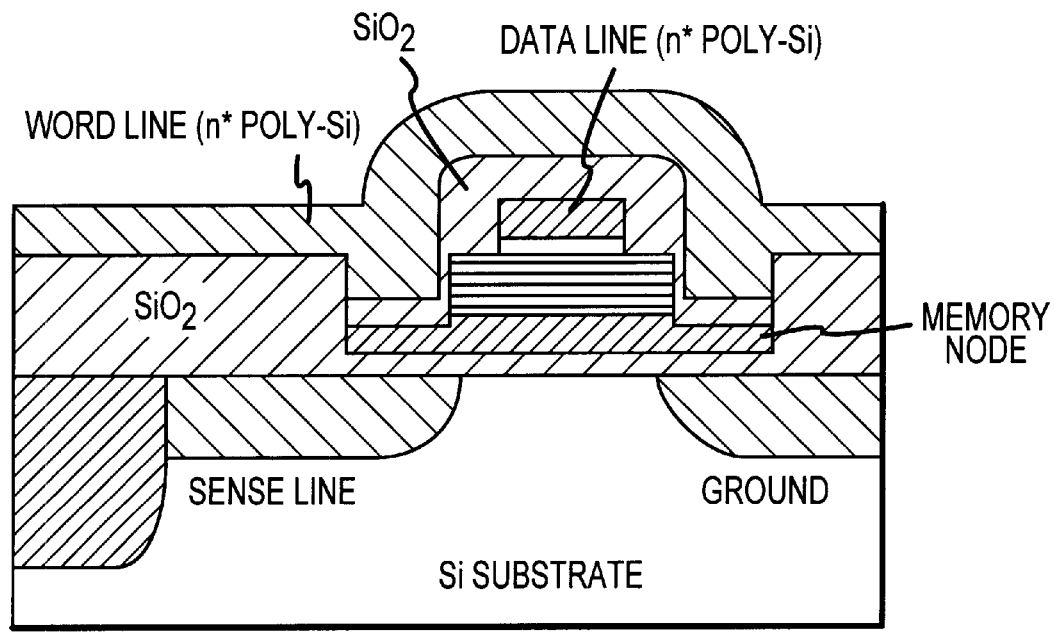
FIG. 1(a) illustrates a cross-sectional view of an STTM cell.
Figure 1B:
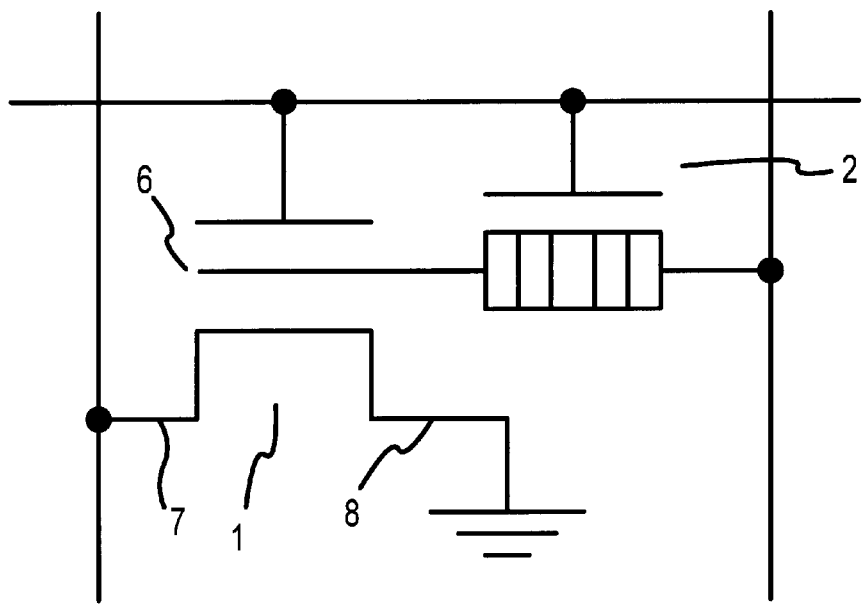
FIG. 1(b) illustrates a schematic circuit diagram of an STTM cell.
Figure 1C:
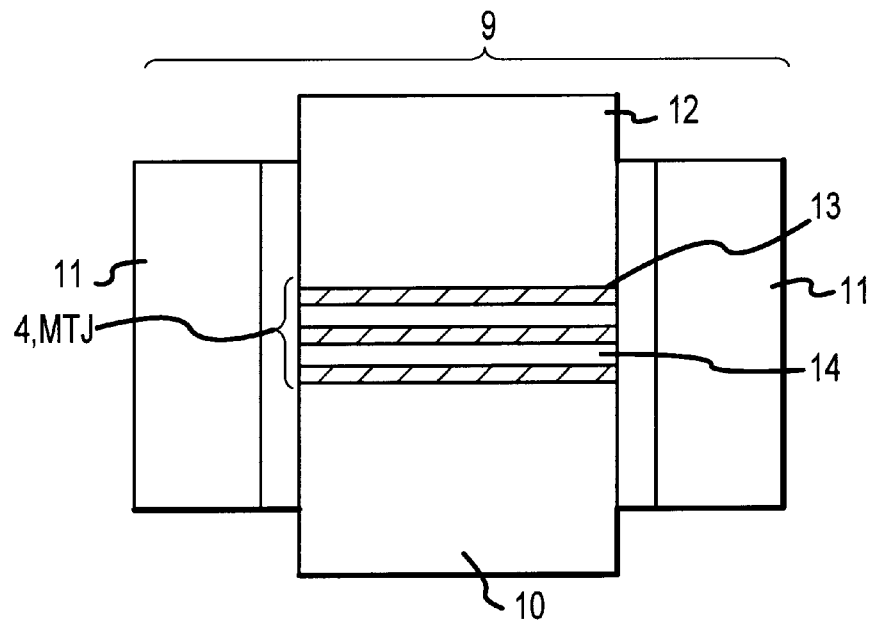
FIG. 1(c) illustrates a cross-sectional view of a programming transistor.
Figure 1D:
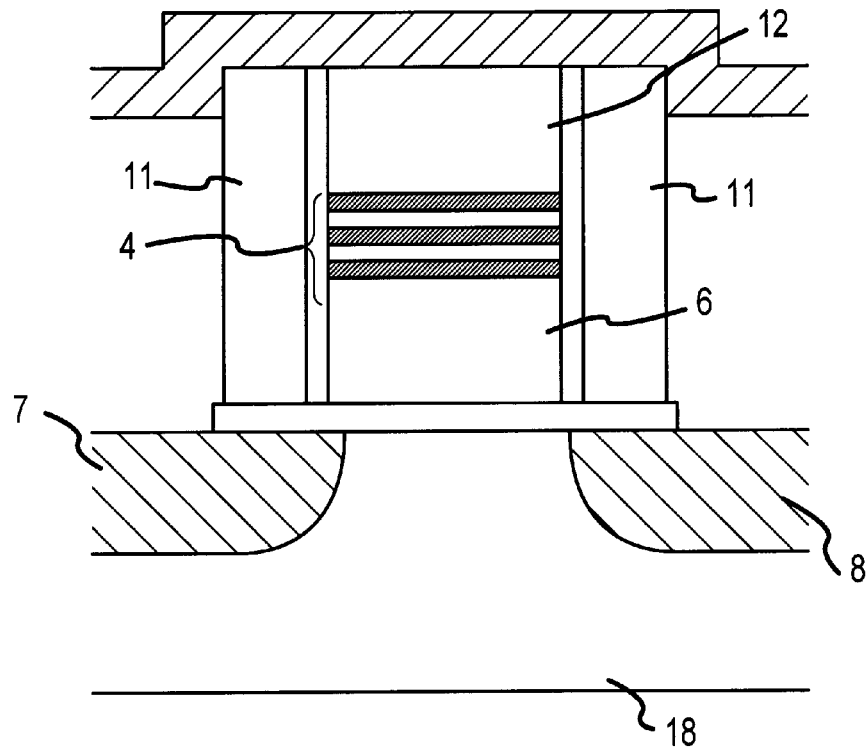
FIG. 1(d) illustrates a cross-sectional diagram of an STTM cell.
Figure 1E:
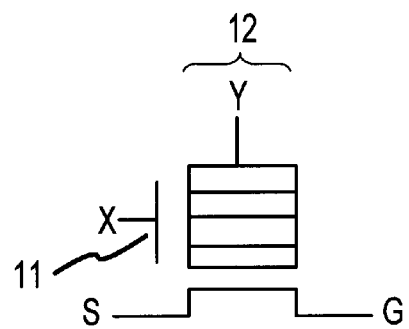
FIG. 1(e) illustrates a conceptual, schematic symbol of an STTM cell.
Figure 1F:
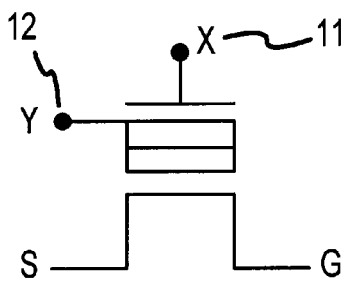
FIG. 1(f) illustrates a conceptual, circuit symbol of an STTM cell.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the present invention to those of ordinary skill in the art. In the drawings, the thickness of layers and regions are exaggerated for clarity. It will also be understood that when line or layer is referred to as being on the substrate, it can be directly on the substrate, and one or more intervening layers may also be present. Further, it will be understood that when a line or layer is referred to as being under another line or layer, it can be directly under, and one or more intervening layers may also be present.

In the present invention, the term planarity means a smooth surface without any peaks and valleys, and the term heavy-doping means greater than $10^{19} cm^{-3}$ doping concentration. Alternate terms used in the description of this invention, which are frequently used in the literature and generally well-known to those of skill in the art are given below for clarity of reference and meaning.

Write Line: word line or control gate line.

Bit Line: read line or sense line.

Sensing Transistor: Bottom Transistor, Read Transistor or Access Transistor.

Programming Transistor: Top Transistor or Write Transistor.

Reference to a x-axis and a y-axis in conjunction with a description of this invention is merely for establishing relative direction of various components of the present STTM memory cell array for purposes of ease of clarity and comprehension for the reader of this description and not for any other purpose. Reference to an x-axis and a y-axis in the description of this invention is not to be interpreted as meaning that the STTM of this invention actually requires any specific x-axis or y-axis relative to any specific physical position on the surface of the STTM, but instead is to be interpreted as providing only direction, relative configuration and guidance as to the various components of the STTM of the present invention. Accordingly, the reference to any x-axis or y-axis is meant to be interpreted in a directional sense only, i.e., horizontal versus vertical relative to a plane, and accordingly, the reference thereof in the specification and the claims should not be used to purposefully interpret the scope of the claims of the present invention as requiring a particular x-axis or y-axis.

Figure 3A:
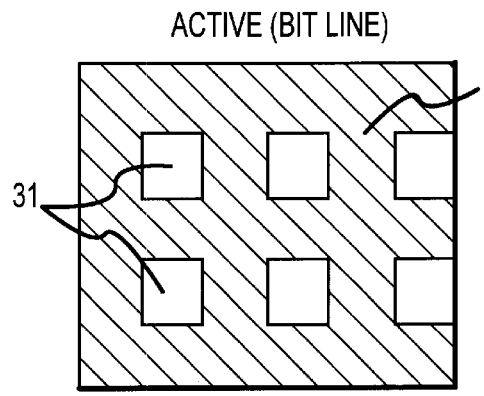
FIG. 3(a), FIG. 3(b), FIG. 3(c) and FIG. 3(d) illustrate top, schematic views of an array of STTM cells showing the relative layout of MTJs, bit lines, data lines, and control gate lines.
Figure 3B:
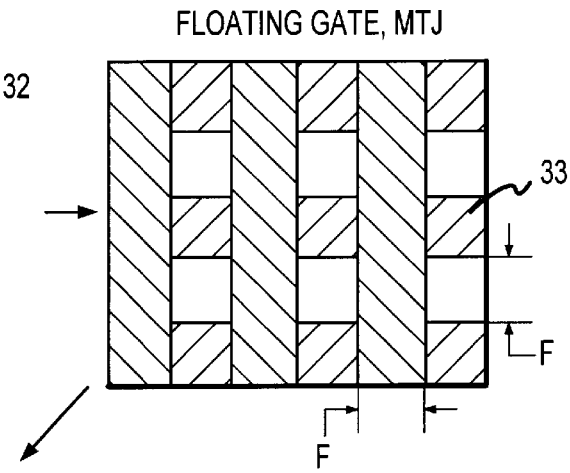

Referring now to FIG. 3(a), a plurality of island-shaped isolation regions (31) are disposed on a semiconductor substrate to define an active region (32) having a mesh configuration. The semiconductor substrate material may be selected from a group consisting of silicon, silicon-germanium, silicon-germanium on silicon, silicon-germanium-carbide on silicon, and silicon on insulator (SOI). Referring to FIG. 3(b), multi-layered patterns (33) shown as having a square-shape are disposed on the active region (32) between the isolation regions (31) which are arrayed in a column running in a direction parallel with a y-axis. Each of the multi-layered patterns comprises an insulated storage node (6), a MTJ barrier (4) and a source electrode (12), which are sequentially stacked. The multiple tunnel junction (MTJ) barrier consists of alternating layers of a low band gap (<3.5 eV) semiconductor layer and a large band gap (<10 eV) insulator layer. The MTJ barrier in a STTM cell includes at least two low band gap semiconductor layers (14), which are overlapped, and at least one large band gap insulator layer (13), which is interposed between the low band gap semiconductor layers. The number of alternating layers forming the multiple tunnel junction barrier can be as high as 20 layers. The alternating low band gap semiconductor layers of the multiple tunnel junction barrier may be made using materials selected from the group consisting of silicon, germanium, silicon germanium and silicon germanium carbide. The alternating large band gap insulator layers of the multiple tunnel junction barrier may be made from materials selected from the group consisting of silicon dioxide, silicon nitride, silicon oxy-nitride, metal oxides (ex.: $Al_2O_3$, $HfO_x$, $ZrO_x$), metal nitrides (ex.: AlN) and metal silicates. Source of the programming (top) transistor and the floating gate of the sensing (bottom) transistor (which also functions as drain of the programming transistor) are made of doped semiconductors selected from the group consisting of silicon, germanium, silicon germanium, and silicon germanium carbide.

Figure 3C:
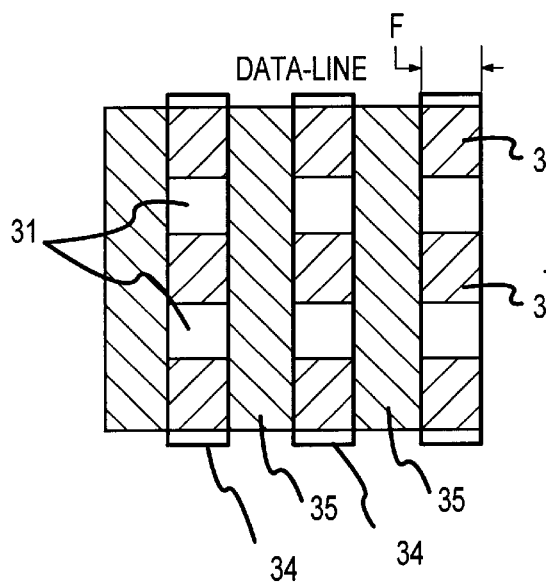

Referring to FIG. 3(c), a plurality of data lines (34) are disposed in a column running in a direction parallel with the y-axis. Each of the data lines (34) runs over the isolation regions (31) and the MTJs (33). The data line is electrically connected to the underlying source regions (12) of the programming (top) transistor (2). The data lines may comprise a material selected from the group consisting of heavily doped silicon, polycide, metal-silicides, metals, and their multi-layer combinations. Also, the active regions (35) between the data lines (34), within the substrate (18), are doped with impurities to form bit lines. These continuous running doped regions (35) run in a direction parallel with a y-axis and function as the source (8) and drain (7) regions of the sensing (bottom) transistor (1). If the continuous bit line regions (35), running parallel with the Y-axis within the semiconductor substrate, are heavily doped, then no additional metallization may be required to form the bit lines. The bit lines may further comprise a material selected from the group consisting of a heavily doped silicon, polycide, metal-silicides, metals, and their multi-layer combinations formed on the doped regions (7 and 8) in the substrate (18).

Figure 3D:
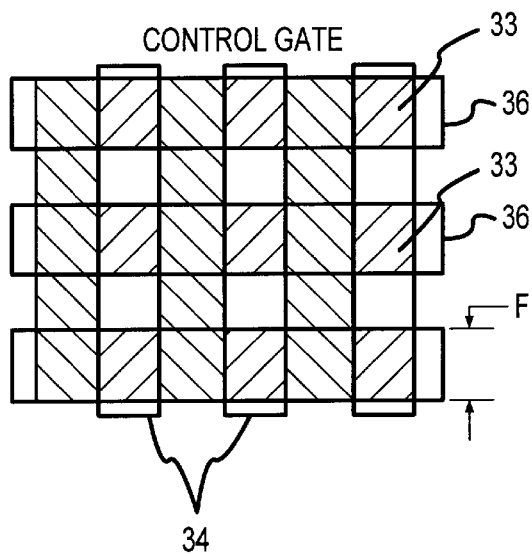

Referring to FIG. 3(d), a plurality of word lines 36 (i.e., control gate lines) cross over the data lines (34) and run over the MTJs (33) in a direction parallel with a x-axis of the array. The word lines may also comprise a material selected from the group consisting of a heavily doped silicon, polycide, metal-silicides, metals, and their multi-layer combinations. Thus, it is possible to reduce the unit cell area to $4F^2$, where F is a minimum feature size. That is to say, in the compact layout, F also corresponds to the width and separation of the data lines, bit lines and the word lines. A self-aligned process is used to achieve such a compact STTM cell array. The space between word lines on top of the bit lines is filled with an insulating material to obtain a smooth surface across the cell array.

In the STTM cell layout, the data line and the bit line are extended to the core region and should be electrically connected to a column decoder. As a result, the data line extension and the bit line extension are arrayed within a cell pitch of 2F. Thus, it is difficult to form contact holes on the data line extension and the bit line extension or to place data line extension on top of the contact holes, since the overlap margin between the contact hole and the extension is restricted. Therefore, it is required to make a novel array of the data line extension and the bit line extension and a novel column addressing scheme appropriate to the novel array.

The column addressing scheme and the layout of the bit line extensions and data line extensions in the core region will now be described with reference to the drawings.

Figure 2:
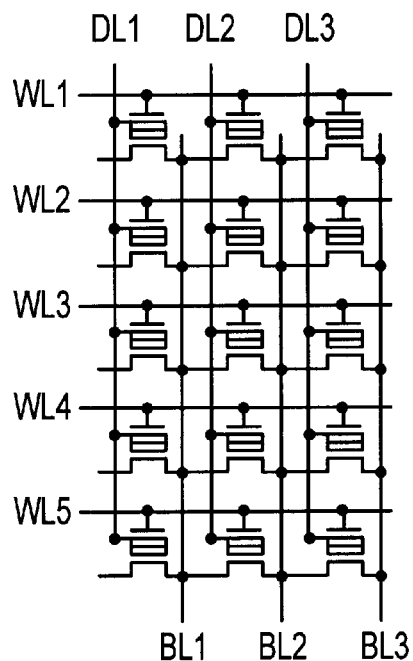
FIG. 2 illustrates a conceptual, circuit diagram of an array of STTM cells.
Figure 4:
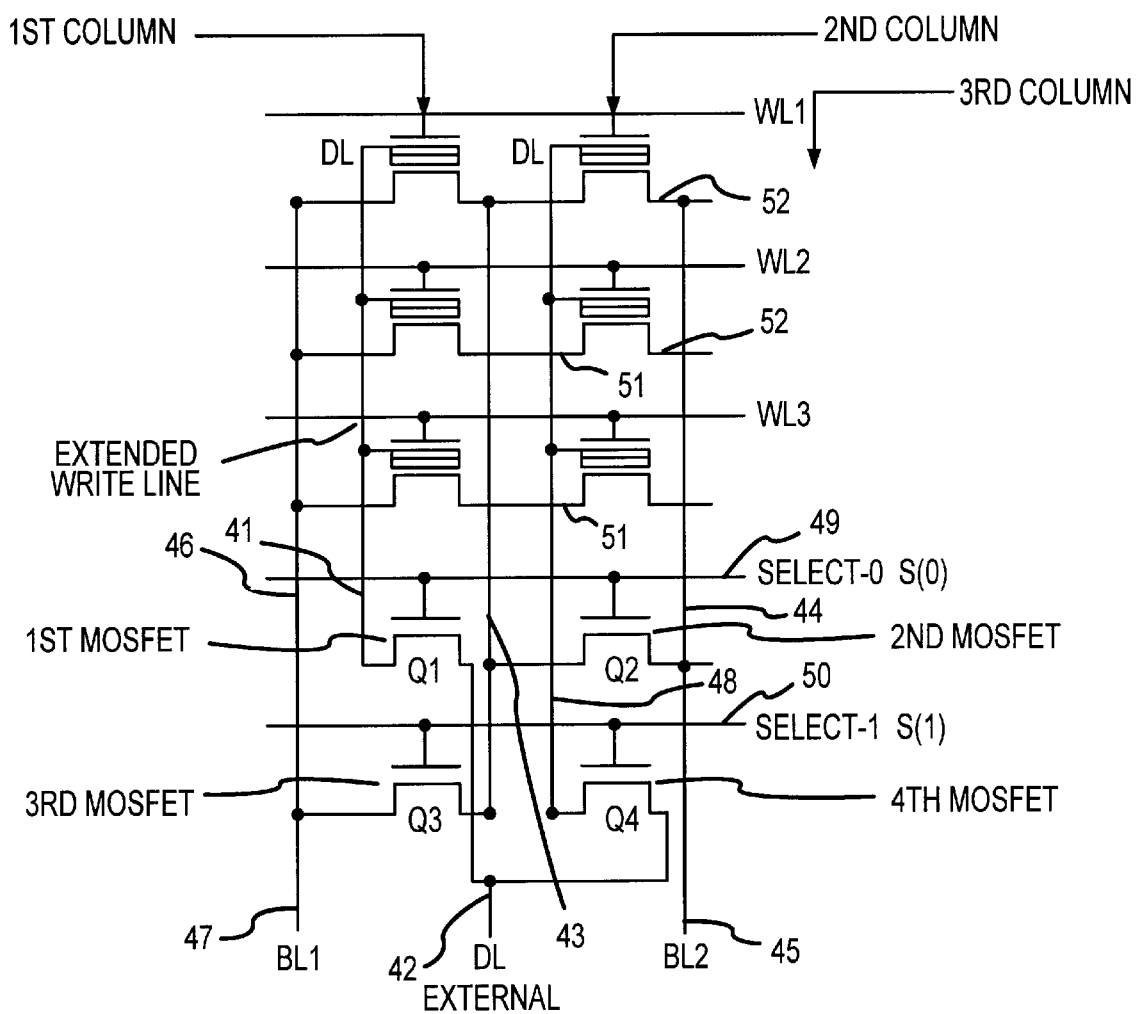
FIG. 4 illustrates a conceptual, circuit diagram of an array of STTM cells including extended and external bit lines and data lines, and an addressing circuit for an array of STTM cells.

FIG. 4 is an equivalent circuit diagram for illustrating a column addressing scheme according to an embodiment of the present invention. Here, the equivalent circuit of the cell array region is identical to the circuit shown in FIG. 2. The explanation for the cell array is already given in the section Description of the Related Art for FIG. 2 and hence it is not re-described here.

Referring to FIG. 4, the bit lines and the data lines are extended to the core region. The extended data line (41) of the first column is electrically connected to a drain (or a source) of a first MOS transistor (Q1), and a source (or a drain) of the first MOS transistor is electrically connected to an external data feed line (DL) 42. Also, the extended bit line (43) of the second column is electrically connected to a drain (or source) of a second MOS transistor (Q2) and to a source (or drain) of a third MOS transistor (Q3), and a source (or a drain) of the second MOS transistor Q2 is connected to the extended bit line (44) of the third column and to a second external bit line (BL2) 45. In addition, a drain (or a source) of the third MOS transistor Q3 is connected to the extended bit line (46) of the first column and to a first external bit line (BL1) 47. Subsequently, the extended data line (48) of the second column is connected to a drain (or a source) of a fourth MOS transistor 04, and a source (or a drain) of the fourth MOS transistor Q4 is connected to the external data feed line (DL) 42. Gate electrodes of the first (Q1) and second (02) MOS transistors are connected to a first selection line S(0) 49, and gate electrodes of the third (Q3) and fourth (Q4) MOS transistors are connected to a second selection line S(1) 50. Here, each of the bit lines is disposed between the two adjacent columns of STTM cells. In other words, the two adjacent columns share one bit line.

The method of driving the above circuit will now be described. First, one of the first and second selection lines S(0) and S(1) is selected. Here, the first selection line S(0) always has a complementary data of the second selection line S(1). In other words, if the logic 1 signal is applied to the first selection line S(0), then the logic 0 signal is applied to the second selection line (S1). In this case, the first (Q1) and second (Q2) MOS transistors are turned on, and the third (Q3) and fourth (Q4) MOS transistors are turned off. Accordingly, the external data feed line (DL) 42 is electrically connected to the extended data line of the first column (41) through the first MOS transistor (Q1), whereas the external data feed line (DL) 42 is electrically disconnected to the extended data line of the second column (48) due to the fourth MOS transistor (Q4). Also, the second external bit line (BL2) 45 is electrically connected to the extended bit line of the second column 43 through the second MOS transistor (Q2). Thus, the sources (51) of the sensing (or read or bottom) transistors of the STTM cells in the second column have the same potential as the drains (52) thereof. As a result, the first column of STTM cells is selected. Subsequently, one of the cells in the first column can be selected by applying the logic 1 signal to one of the word (also known as write or control gate) lines (WL1 to WL3). Here, in the event that the write voltage is applied to the selected word line and the appropriate signal (logic 0 or 1) is applied to the external data feed line (DL) 42, write operation is achieved. The write voltage results in tunneling of carriers across the MTJ barrier from the data line to the storage (memory) node of the STTM cell. Also, in the event that the read voltage is applied to the selected word line and there is a voltage difference between the first (47) and second (45) external bit lines (BL1 and BL2), read operation is performed. In order to retain the charge stored in the memory node a standby voltage may be applied to the word line. The read voltage also keeps the charge stored in the memory node of the STTM cell and, in addition, allows information stored in the memory node to be read through the source/drain path of the sensing (bottom) transistor. The threshold voltage and hence the conducting mode of the sensing (bottom) transistor depends upon the charge stored in the memory node.

In the meantime, if the logic 0 signal is applied to the first selection line (S0), it is obvious that the second column is selected. This is because logic 1 signal is applied to the second selection line (S1) at the same time logic 0 signal is applied to the first selection line (S0).

Figure 5:
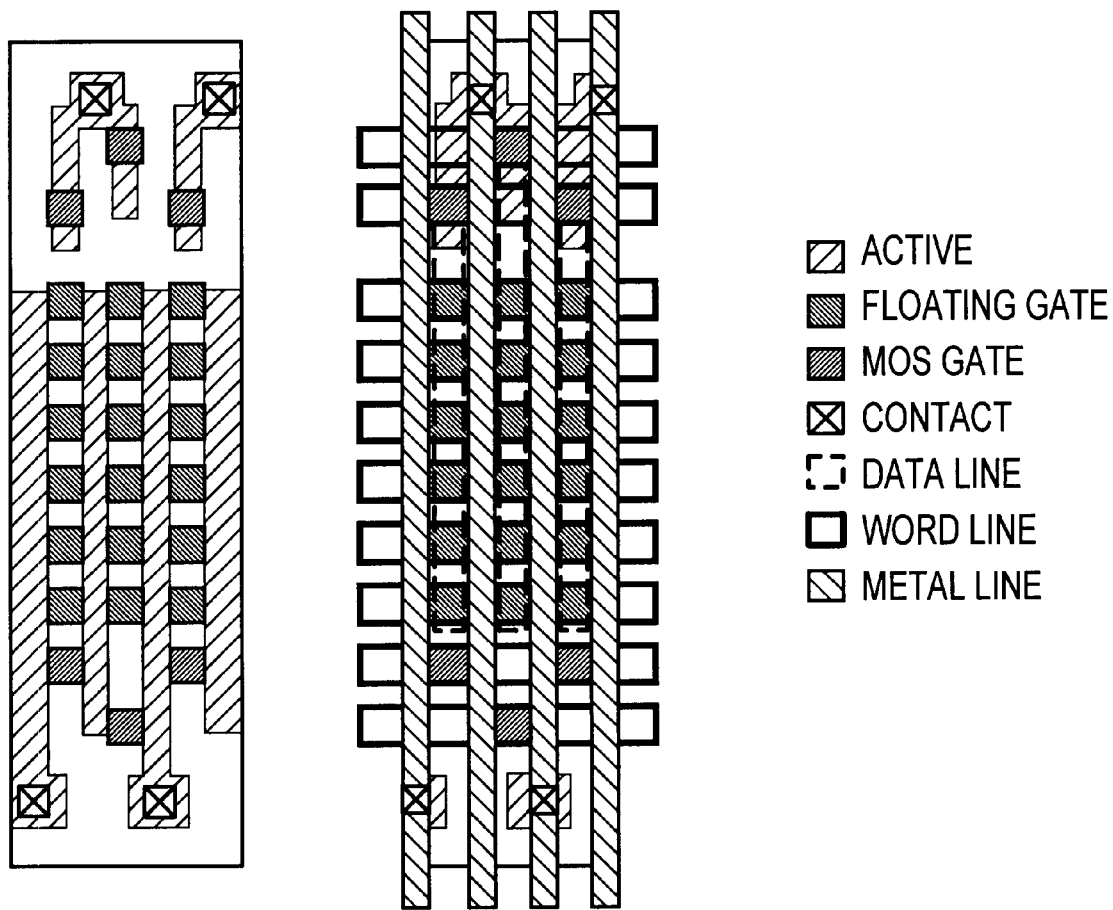
FIG. 5 illustrates a top, schematic, see-through view of an array of STTM cells showing an example of layouts for realizing the circuit shown in FIG. 4 on the semiconductor substrate.

FIG. 5 shows an example of layouts for realizing the equivalent circuit of FIG. 4 on the semiconductor substrate (18). Referring to FIG. 5, all the bit lines are extended toward one side of the column line, and all the data lines are extended toward the opposite side to the extended bit lines. In addition, it is allowable to dispose the contact hole on every other extended bit line. Also, it is allowable to dispose the contact hole on every other extended data line. As a result, it is possible to increase the overlap margin between the contact hole and the extended control line (the extended bit line or the extended data line).

Thus, a method of designing the layout of a compact STTM cell array and the layout of the bit line and data line extensions in the core region, a column addressing scheme, and a driving method of the circuit have been described according to the present invention. While the invention is susceptible to various modifications and alternative forms, specific embodiments have been shown by way of example in the drawings and described in detail herein. However, it should be understood that the invention is not limited to the particular layout design conditions disclosed herein. Rather, the invention covers all modifications, equivalents, and alternatives falling within the spirit and scope of the invention as set forth and defined in the appended claims.

What is claimed is:

1. A semiconductor device having a scalable two-transistor memory (STTM) cell array comprising:

a semiconductor substrate;

a plurality of memory cells on the substrate arranged in a planar matrix having an x-axis and a y-axis;

each memory cell having a bottom transistor and a top transistor in a stacked configuration;

island type isolation regions located in the substrate between and adjacent to memory cells, the island type isolation regions and the adjacent memory cells forming columns parallel to the y-axis of the matrix with source and drain regions of the bottom transistor located between the columns;

three types of control lines, including bit lines, data lines, and word lines, each bit line and data line extending in a direction parallel with the y-axis in an alternating manner and the word line extending in a direction parallel with the x-axis;

wherein each bit line being electrically connected to source/drain regions of adjacent bottom transistors along each column, each data line being electrically connected to the source regions of top transistors along each column of the island type isolation regions and adjacent memory cells, and each word line being electrically connected to gates of the top transistors in a row; and whereby a unit cell of the plurality of memory cells occupies a minimum area equal to $4F^2$, where F represents a minimum feature size.

2. The semiconductor scalable two-transistor memory (STTM) cell array as claimed in claim 1, wherein F is represented by a width of a data line, a bit line or a word line or a distance between two adjacent data lines, bit lines or word lines.

3. The semiconductor scalable two-transistor memory (STTM) cell array as claimed in claim 1, wherein the bottom transistor is a floating gate MOSFET and the top transistor is a vertical double sidewall gated MOSFET with a multiple tunnel junction (MTJ) barrier sandwiched between a source and a drain, and the floating gate of the bottom transistor functioning as the drain of the top transistor and the source of the top transistor is available as a node at the top of the cell.

4. A semiconductor scalable two-transistor memory cell array as claimed in claim 1, wherein the semiconductor substrate material is selected from the group consisting of silicon, silicon-germanium, silicon-germanium on silicon, silicon-germanium-carbide on silicon, and silicon on insulator (SOI).

5. A semiconductor scalable two-transistor memory cell array as claimed in claim 3, wherein the multiple tunnel junction barrier consists of alternating layers of a low band gap semiconductor layer and a large band gap insulator layer.

6. A semiconductor scalable two-transistor memory cell array as claimed in claim 5, wherein the number of alternating layers forming the multiple tunnel junction barrier is between 2 to 20 layers.

7. A semiconductor scalable two-transistor memory cell array as claimed in claim 5, wherein the alternating low band gap semiconductor layers of the multiple tunnel junction barrier have a band gap of less than 3.5 eV.

8. A semiconductor scalable two-transistor memory cell array as claimed in claim 7, wherein the alternating low band gap semiconductor layers of the multiple tunnel junction barrier are selected from the group consisting of silicon, germanium, silicon germanium, and silicon germanium carbide.

9. A semiconductor scalable two-transistor memory cell array as claimed in claim 5, wherein the alternating large band gap insulator layers of the multiple tunnel junction barrier have a band gap of less than 10 eV.

10. A semiconductor scalable two-transistor memory cell array as claimed in claim 9, wherein the alternating large band gap insulator layers of the multiple tunnel junction barrier are selected from the group consisting of silicon oxide, silicon nitride, silicon oxy-nitride, metal oxides, metal nitrides and metal silicates.

11. A semiconductor scalable two-transistor memory cell array as claimed in claim 1, wherein the bit lines are continuous, heavily doped regions running parallel with the Y-axis within the semiconductor substrate and also function as source/drain regions of the bottom transistors.

12. A semiconductor scalable two-transistor memory cell array as claimed in claim 11, wherein the bit lines are heavily doped silicon, metal, metal silicide, or polycide layers or their multi-layer combinations formed on top of the continuous doped source/drain regions of the bottom transistors within the semiconductor substrate along the columns.

13. A semiconductor scalable two-transistor memory cell array as claimed in claim 1, wherein the space between word lines on top of the bit lines is filled with an insulator material.

14. A semiconductor scalable two-transistor memory cell array as claimed in claim 1, wherein the data lines and word lines are selected from the group consisting of a heavily doped silicon, polycide, metal-silicides, metals, and their multi-layer combinations.

15. A semiconductor scalable two-transistor memory cell array as claimed in claim 3, wherein the source of the top transistor and the floating gate of the bottom transistor, which also functions as the drain of the top transistor, are doped semiconductors selected from the group consisting of silicon, germanium, silicon germanium, and silicon germanium carbide.

16. A method of manufacturing a scalable two-transistor memory (STTM) cell array, comprising the steps of:

forming an island type isolation regions in the substrate;

forming a planar array of memory cells having two transistors, each memory cell having a top transistor on a bottom transistor on a semiconductor substrate, the array having symmetry along an x-axis and a y-axis, the array having rows of memory cells running parallel with the x-axis and columns of memory cells running parallel with the y-axis;

forming data lines over each of the column of memory cells;

forming bit lines between all adjacent columns of memory cells; and forming word lines over each of the row of memory cells;

whereby a unit cell of the plurality of memory cells occupies a minimum area equal to $4F^2$, where F represents a minimum feature size.

17. A method of manufacturing a scalable two-transistor memory (STTM) cell array as claimed in claim 16, wherein F is represented by a width of a data line, a bit line or a word line or a distance between two adjacent data lines, bit lines or word lines.

18. A semiconductor scalable two-transistor memory cell array as claimed in claim 1, wherein the bit lines and data lines are extended to the core region for making connections to an address system circuitry.

* * * * *